(12) United States Patent
Song et al.

(10) Patent No.: US 8,707,550 B2
(45) Date of Patent: Apr. 29, 2014

(54) BONDING MACHINE INCORPORATING DUAL-TRACK TRANSFER MECHANISM

(75) Inventors: Keng Yew James Song, Singapore (SG); Ka Shing Kenny Kwan, Singapore (SG); Choong Kead Leslie Lum, Singapore (SG); Ting Yu He, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 992 days.

(21) Appl. No.: 12/508,780

(22) Filed: Jul. 24, 2009

(65) Prior Publication Data

US 2011/0016707 A1    Jan. 27, 2011

(51) Int. Cl.
*H01L 21/58* (2006.01)
*H01L 21/60* (2006.01)
*H05K 13/04* (2006.01)

(52) U.S. Cl.
USPC ............ 29/739; 29/741; 29/759; 29/760; 29/832; 228/4.5; 228/49.5; 228/180.5

(58) Field of Classification Search
CPC ................ H01L 24/85; H05K 13/04
USPC ............ 29/739–741, 743, 759, 760, 832; 414/268–272, 325; 438/26, 28; 228/4.5, 180.5, 49.1, 49.5
See application file for complete search history.

(56) References Cited

U.S. PATENT DOCUMENTS

| | | | |
|---|---|---|---|
| 6,892,446 B2 * | 5/2005 | Hwang et al. | 29/740 |
| 2002/0062553 A1 * | 5/2002 | Hwang et al. | 29/832 |

* cited by examiner

*Primary Examiner* — Livius R Cazan
(74) *Attorney, Agent, or Firm* — Ostrolenk Faber LLP

(57) ABSTRACT

A bonding apparatus for bonding electronic devices including substrates comprises first and second rails arranged adjacent to each other which are configured to align the substrates in vertical orientations during transportation along the rails. A bonding system is locatable over a first bonding site which is located along the first rail and a second bonding site which is located along the second rail. A first indexer is located adjacent to the first rail and a second indexer is located adjacent to the second rail wherein each indexer is independently operative to transport a substrate along one rail while a substrate held on the other rail is being bonded. A container located at one end of the rails for holding multiple unbonded substrates is operative to feed unbonded substrates directly to the rails.

9 Claims, 2 Drawing Sheets

BONDING MACHINE INCORPORATING DUAL-TRACK TRANSFER MECHANISM

FIELD OF THE INVENTION

The invention relates to a bonding machine for electronic devices, and in particular to a bonding machine incorporating a dual-track transfer mechanism for loading and unloading electronic devices such as leadframes for bonding.

BACKGROUND AND PRIOR ART

In back-end semiconductor assembly processes involving electronic devices such as vertical light-emitting diode ("LED") devices, thermosonic ball bonding is a primary process used for forming electrical interconnections. Vertical LEDs are mounted on substrates arranged in a vertical orientation in a magazine and fed into a bonding machine vertically for bonding. Bonding is carried out to electrically connect an LED mounted on an edge of a standing substrate, such as a leadframe, to the substrate itself. Vertical LEDs have several advantages over more conventional lateral LEDs. Current spreading is significantly enhanced in vertical LEDs which may lead to reduced series resistance as compared to lateral LEDs. As a result, the light output and power conversion efficiency of vertical LEDs are also greatly improved at high injection currents. Furthermore, vertical LEDs show minimal degradation of optical power when subjected to a stress test at a current of about 400 mA, whereas the same stress will result in the destruction of the lateral LED due to increased current crowding and self-heating.

To connect an LED to a leadframe in a vertical LED device, a thin wire such as gold wire of 20 to 75 microns in diameter is bonded onto a circuit pad on the LED before bonding onto a corresponding lead of the leadframe on which the LED is mounted. In order to transport successive vertical LED devices into a bonding area, a leadframe transportation device including a linear indexing system or an indexer transports a leadframe at high speed along a leadframe transporting track or rail. As the speed of wire bonding vertical LEDs increases, it is desirable to correspondingly increase the operational speeds of subsystems working in conjunction with a wire bonding machine.

Conventional leadframe transportation devices for transporting vertical LEDs may use a single track leadframe feeding system to index a leadframe so that bonding and indexing are performed in series. The bonding system is idle when an indexer pushes out a bonded leadframe before feeding an unbonded leadframe to a bonding site. The idling time of the bonding system may increase as much as 30% when the bonding speed is high.

Leadframe transportation devices incorporating a dual-track leadframe feeding system have been devised to reduce the idling time of the bonding system as compared to when a single track leadframe feeding system is used. Two dual-track leadframe feeding systems are illustrated in FIGS. 1 and 2. FIG. 1 shows a top view of a conventional synchronous dual-track leadframe feeding system 100 incorporating a synchronous indexer 102. The synchronous dual-track leadframe feeding system 100 comprises a first track or front leadframe rail 108 and a second track or rear leadframe rail 110 which is fixedly located parallel to the front leadframe rail 108 at a predetermined distance from the front leadframe rail 108 such that the pitch of the rails 109 is fixed. There is also a pre-heater block 104 and a heater block 106 with bonding sites located at opposite sides of the heater block 106, and a bonding system 107 that is locatable over the two bonding sites.

An indexing actuator activates the synchronous indexer 102 to feed an unbonded leadframe 112 each onto the front leadframe rail 108 and the rear leadframe rail 110 from a leadframe magazine located at a first end of the synchronous dual-track leadframe feeding system 100. The two unbonded leadframes 112 are indexed together along the dual tracks towards the opposite end of the tracks and are heated at the pre-heater block 104 before being indexed to the heater block 106 for further heating before bonding. The bonding system 107 is movable between the front leadframe rail 108 and the rear leadframe rail 110 to perform bonding at each leadframe 112. After the vertical LEDs on the two bonded leadframes 112 have been completely bonded, the two bonded leadframes are indexed together downstream and unloaded into a magazine. At the same time, another two unbonded leadframes 112 are fed to the first end of the dual tracks 108, 110. The bonding system 107 would be idle and unproductive during the loading and unloading of the leadframes 112 to and from the synchronous dual-track leadframe feeding system 100. Thus, the synchronous dual-track leadframe feeding system 100 still relies on a series bonding and indexing sequence as the single track feeding system described above. The throughput gain over a conventional single track feeding system is hence minimal.

Moreover, since the pitch distance between the dual tracks is fixed, the synchronous dual-track leadframe feeding system 100 is customized based on the pitch of a selected magazine. This limits the flexibility of handling magazines of varying pitches. At the same time, having only a single pre-heater block 104 and a single heater block 106 between the first and second tracks 108, 110 which are in contact with the dual tracks causes the transmission of undesirable vibrations resulting from the opening or closing of leadframe clamps on each leadframe from one track to the other. Hence, wire bonding at one leadframe 112 is preferably stopped when another leadframe 112 is being clamped or unclamped, otherwise inaccurate bonding will result.

FIG. 2 shows a top view of an improved conventional buffer table dual-track leadframe feeding system 100' incorporating two buffer tables comprising a buffer loader 114 and a buffer unloader 116. The dual tracks comprise front and rear leadframe rails 118, 120 arranged parallel to each other. The front leadframe rail 118 is in contact with a front pre-heater block 117 and a front heater block 119. A rear pre-heater block 121 and a rear heater block 123 are located on the rear leadframe rail 120 and are separated from the front pre-heater block 117 and the front heater block 119, hence vibrations from the opening or closing of leadframe clamps on one leadframe will not affect the leadframe on the other. Wire bonding of a leadframe does not have to stop during clamping or unclamping of the other leadframe unlike in the prior art described above.

The front and rear leadframe rails 118, 120 each receives a leadframe 112 from an input magazine 122 via the buffer loader 114 using a buffer loader indexer 113 and either a front indexer 128 or a rear indexer 130. A bonding site is located adjacent to each track so that wire bonding may be carried out alternately at each bonding site. Each bonded leadframe 112 is unloaded to an output magazine 124 via the buffer unloader 116 using a buffer unloader indexer 125 and either the front indexer 128 or the rear indexer 130. The buffer loader 114 is movable along a first rail 115 for aligning itself with the input magazine 122 and either the front or rear leadframe rails 118, 120 for transferring one unbonded leadframe 112 each time from the input magazine 122 to either the front or rear leadframe rails 118, 120. Likewise, the buffer unloader 116 is movable along a second rail 127 for aligning itself with the output magazine 124 and either the front or rear leadframe rails 118, 120 for transferring one bonded leadframe 112 each time from either the front or rear leadframe rails 118, 120 to the output magazine 124. Hence, the operation speed of the buffer loader 114 and the buffer unloader 116 affects the throughput of the system significantly and causes a bottleneck in the bonding operation since bonding speed is generally very fast. The idling time of the bonding system 126 during feeding is comparatively long as compared to the bonding time. Furthermore, since loading and unloading of leadframes 112 to and from the front or rear leadframe rails 118, 120 require two buffer tables, when one buffer table breaks down, the whole buffer table dual-track leadframe feeding system 100' cannot continue to operate and bonding must stop.

Additionally, the length of the buffer loader 114 and the buffer unloader 116 must be sufficient to accommodate the whole length of the leadframes. Increasing the length of the two buffer tables to accommodate longer leadframes will correspondingly increase the machine length. This results in a larger footprint which takes up valuable space. The buffer table dual-track leadframe feeding system 100' also has more components and hence is more complex as compared to the synchronous dual-track leadframe feeding system 100. As a result, there is a higher risk of machine failure due to malfunction of the devices. More significantly, the high speed movement of the buffer loader 114 and the buffer unloader 116 during alignment generates substantial vibration which significantly limits the speed and accuracy of wire bonding during wire bonding operations since the bonding system 126 and the front and rear leadframe rails 118, 120 are coupled to the two buffer tables. Conversely, the accuracy of the indexing motion is also affected by vibrations of the bonding system 126 during wire bonding.

It is therefore necessary to look into methods to reduce the idling time of the bonding system to increase throughput when bonding leadframes. It is also desirable to devise a system which is sufficiently versatile to carry out wire bonding on leadframes of varying lengths without substantial modification to the system. Eliminating the undesirable effects of vibrations of the various subsystems working together is also important in order to improve the accuracy of wire bonding.

SUMMARY OF THE INVENTION

It is thus an object of this invention to seek to provide a less complex bonding machine which has improved efficiency in transporting leadframes for bonding while facilitating more accurate bonding.

According to a first aspect of the invention, there is provided a bonding apparatus for bonding electronic devices including substrates, comprising: first and second rails arranged adjacent to each other which are configured to align the substrates in vertical orientations during transportation along the rails; a bonding system locatable over a first bonding site located along the first rail and a second bonding site located along the second rail; a first indexer located adjacent to the first rail and a second indexer located adjacent to the second rail, each indexer being independently operative to transport a substrate along one rail while a substrate held on the other rail is being bonded; and a container located at one end of the rails for holding multiple unbonded substrates and operative to feed unbonded substrates directly to the rails.

According to a second aspect of the invention, there is provided a method of bonding electronic devices including substrates, comprising the steps of: providing first and second rails arranged adjacent to each other; feeding unbonded substrates from a container holding multiple unbonded substrates directly to the rails from one end of the rails while aligning the substrates in vertical orientations during transportation along the first and second rails; transporting a substrate on the first rail with a first indexer to a first bonding site located along the first rail, and locating a bonding system over the first bonding site to bond the substrate on the first rail; moving a substrate on the second rail with a second indexer to a second bonding site located along the second rail while the substrate on the first rail is being bonded; after bonding at the first bonding site is completed, locating the bonding system over the second bonding site to bond the substrate on the second rail; and moving the bonded substrate with the first indexer to unload the bonded substrate while the substrate on the second rail is being bonded.

It would be convenient hereinafter to describe the invention in greater detail by reference to the accompanying drawings which illustrate the preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENTS OF THE INVENTION

The preferred embodiment of the present invention will be described hereinafter with reference to the accompanying drawings.

Figure 1:
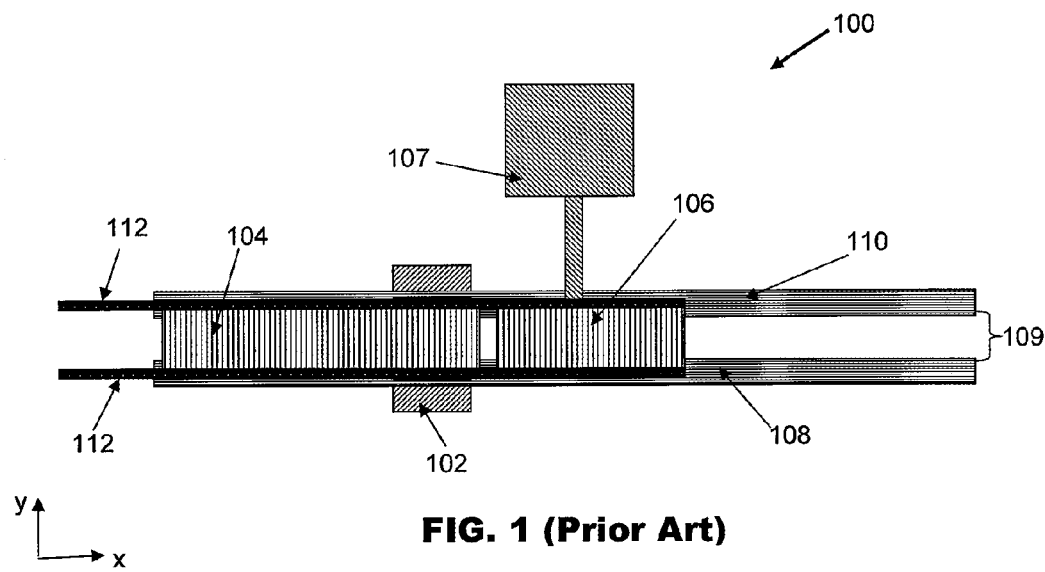
FIG. 1 is a top view of a conventional synchronous dual-track leadframe feeding system incorporating a synchronous indexer.
Figure 2:
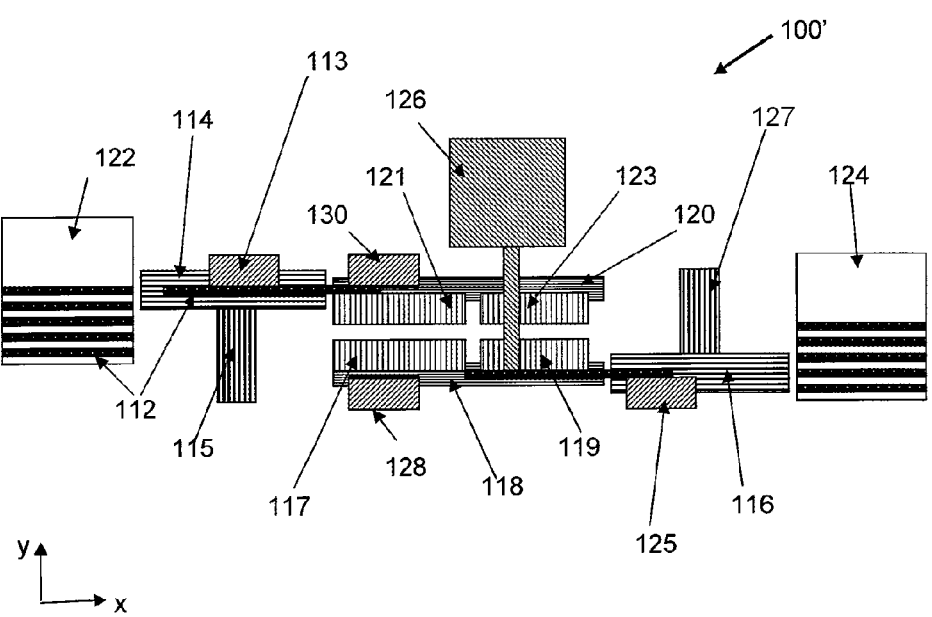
FIG. 2 is a top view of an improved conventional buffer table dual-track leadframe feeding system incorporating two buffer tables comprising a buffer loader and a buffer unloader.
Figure 3:
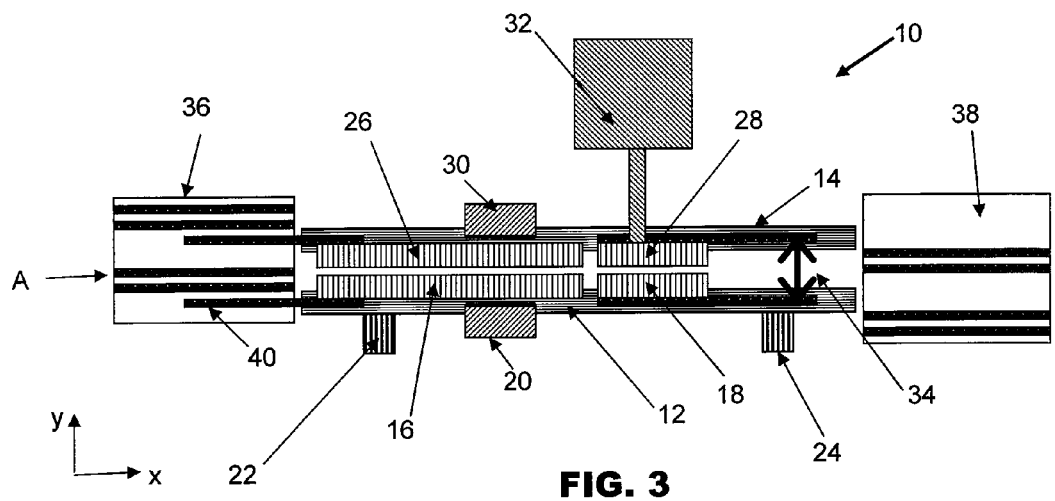
FIG. 3 is a top view of a dual-track leadframe feeding system with adjustable pitch for bonding electronic devices including substrates such as leadframes according to the preferred embodiment of the invention.

FIG. 3 is a top view of a dual-track leadframe feeding system 10 with adjustable pitch for bonding electronic devices including substrates such as leadframes according to the preferred embodiment of the invention. The dual-track leadframe feeding system 10 includes front and rear modules which comprise adjustable dual tracks made up of a front leadframe rail 12 and a rear leadframe rail 14 located parallel to the front leadframe rail 12. The front leadframe rail 12 and the rear leadframe rail 14 are each mounted on an independent mounting base so that each rail functions in a single track configuration. The front module further comprises a front pre-heater block 16, a front heater block 18 and a front indexer 20 located adjacent to the front leadframe rail 12. The front leadframe rail 12 is mounted on first and second rail pitch adjustable guides 22, 24.

The rear module is located parallel to the front module and further comprises similar components to the front module, namely a rear pre-heater block 26, a rear heater block 28 and a rear indexer 30 located adjacent to the rear leadframe rail 14. The front pre-heater and heater blocks 16, 18 are spaced from the rear pre-heater and heater blocks 26, 28 in order to isolate vibrations from the front and rear modules. The rear module may be fixed in position while the front module may be movable relative to the rear module by adjusting the first and second rail pitch adjustable guides 22, 24 so as to adjust the rail pitch distance 34 between the front and rear leadframe rails 12, 14 prior to feeding leadframes 40 to the rails.

A bonding system 32 is locatable above a first bonding site located along the front leadframe rail 12 next to the front heater block 18, and a second bonding site located along the rear leadframe rail 14 next to the rear heater block 28. The bonding system 32 makes electrical wire connections between each die mounted on the leadframe and the leadframe. The rail pitch distance 34 is adjustable so that the front and rear leadframe rails 12, 14 can be aligned with a multiple of a leadframe partition pitch of a container such as an input or output magazine 36, 38 so as to be capable of directly receiving two unbonded leadframes 40 or directly unloading two bonded leadframes 40 simultaneously at a same position of the magazine. The input and output magazines 36, 38 are located at opposite ends of the front and rear leadframe rails 12, 14 and are configured for holding multiple unbonded leadframes and bonded leadframes respectively.

In use, the rail pitch distance 34 is first adjusted to align the front and rear leadframe rails 12, 14 with the rail pitch of the input magazine 36 so that the front and rear leadframe rails 12, 14 may directly receive an unbonded leadframe 40 each, and the two leadframes may be ejected from the input magazine 36 simultaneously. The loaded leadframe 40 is aligned in a vertical orientation and is indexed and transported along either the front or rear leadframe rail 12, 14 to be pre-heated in pre-heating zones adjacent to the front pre-heater block 16 and the rear pre-heater block 26. After the full length of the two leadframes 40 enter the front and rear leadframe rails 12, 14, the input magazine 36 moves one leadframe partition pitch sideways to get ready to load the next two leadframes to the respective front and rear leadframe rails 12, 14.

The front and rear indexers 20, 30 independently index and transport each loaded leadframe 40 either at the same time or separately along the front and the rear leadframe rails 12, 14 to the front and rear heater blocks 18, 28 where the first and second bonding sites reside to be heated sufficiently for wire bonding. While the bonding system 32 is located over the first bonding site to bond the leadframe 40 held on the front leadframe rail 12, the second leadframe 40 may be indexed by the second indexer 30 and transported along the rear leadframe rail 14 to the second bonding site.

The bonding system 32 completes wire bonding of the first leadframe 40 at the first bonding site held on the front leadframe rail 12 before it moves and is located over the second bonding site to commence bonding the second leadframe 40 held on the rear leadframe rail 14. Before the bonding system 32 completes bonding the second leadframe 40 and moves to perform bonding at the front leadframe rail 12, the front indexer 20 has sufficient time to index and unload the bonded leadframe 40 on the front leadframe rail 12 and feed another unbonded leadframe 40 from a standby zone at the front pre-heater block 16 to the first bonding site. As the rail pitch is a multiple of the magazine leadframe partition pitch of the output magazine 38, the bonded leadframes 40 on the front and rear leadframe rails 12, 14 may be ejected sequentially into the output magazine 38. After the bonded leadframes 40 enter entirely into the output magazine 38, the output magazine 38 moves one leadframe partition pitch to get ready to receive the next bonded leadframe unloaded from the front or rear leadframe rail 12, 14.

Figure 4:
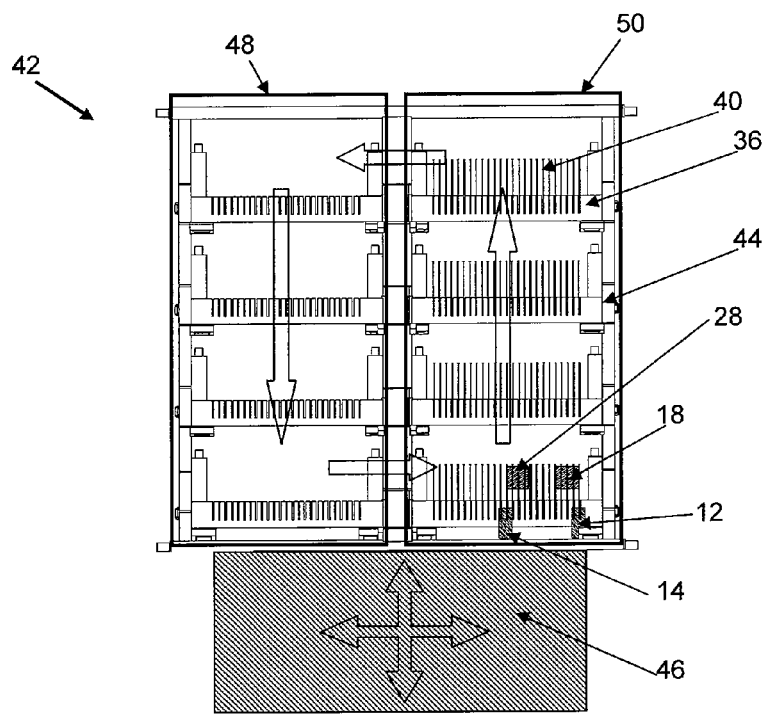
FIG. 4 is a side view of the dual-track leadframe feeding system of FIG. 3 viewed along direction A in FIG. 3 illustrating a feeding sequence of magazine input cassette in a magazine cassette holder according to the preferred embodiment of the invention.

FIG. 4 is a side view of the dual-track leadframe feeding system 10 viewed along direction A in FIG. 3 illustrating a feeding sequence of magazine input cassette 44 in a magazine cassette holder 42 according to the preferred embodiment of the invention. For vertical LED bonding, all the leadframes stored in one input magazine 36 may be unloaded in about 30 seconds with current wire bonding technology. To improve machine mean time between assistance ("MTBA"), each holder for input magazines, such as a magazine input cassette 44, may carry at least 4 input magazines 36 at any one time as compared to conventional magazine cassettes which house only one or two magazines. FIG. 4 illustrates exemplary container holders in the form of an eight-magazine input cassette 44 or two columns of four-magazine input cassettes 44. The magazine input cassette 44 is mounted to a container holder table or magazine input cassette movable table 46. Input magazines 36 held in the magazine input cassette 44 are located in a first column or a left zone 48 and a second column or a right zone 50 of the magazine input cassette 44. Each column of input magazines 36 is alternately movable into alignment with the front and rear leadframe rails 12, 14 so as to be capable of feeding leadframes 40 simultaneously thereto.

The input magazines 36 are loaded with leadframes 40 in both the left and right zones 48, 50 of the magazine input cassette 44. The entire magazine input cassette 44 is continuously moved in directions indicated in FIG. 4 by the magazine input cassette movable table 46 so that loaded input magazines 36 in the right zone 50 are aligned with the front and rear leadframe rails 12, 14 for feeding additional leadframes 40 simultaneously to the rails. When the leadframes 40 held in all the input magazines 36 in the right zone 50 have been fed to the rails, the magazine input cassette 44 is moved to the left zone 48 to continue feeding the leadframes 40 held in the input magazines 36 in the left zone 48 to the rails. At the same time, empty input magazines 36 in the right zone 50 can be taken out and replaced with loaded input magazines 36.

After all the input magazines 36 in the left zone 48 are emptied of leadframes 40, the magazine input cassette 44 is moved back to the right zone 50 which has been loaded with leadframes 40 to continue feeding leadframes 40 in the right zone 50 to the rails. The empty input magazines 36 are removed at the left zone 48 and replaced with fresh input magazines 36 loaded with a plurality of leadframes 40. The loaded input magazines 36 in the left zone 48 are once again ready to feed leadframes 40 to the front and rear leadframe rails 12, 14 after being aligned with the rails. Thus, a continuous leadframe feeding path is provided which may achieve zero magazine change idling time and together with the adjustable rail pitch distance 34, may attain zero idle time for the bonding system 32 as well. Magazine cassettes of the same design may be used to hold loaded output magazines 38 to transport bonded leadframes 40 away from the front and rear leadframe rails 12, 14.

It should be appreciated that the dual-track leadframe feeding system 10 of the preferred embodiment of the present invention achieves swift loading of unbonded leadframes and unloading of bonded leadframes while maintaining relatively accurate wire bonding. The first and second rail pitch adjustable guides 22, 24 adjust the rail pitch distance 34 by shifting the front module relative to the rear module according to the magazine leadframe partition pitch. In this way, the dual-track leadframe feeding system 10 may be used with magazines of varying leadframe partition pitches.

Unlike in the prior art synchronous dual-track leadframe feeding system 100, wire bonding at one rail can continue during clamping or unclamping of a leadframe along the other rail without disturbance from vibration transmitted from an indexer. This is achievable since vibrations due to clamping or unclamping of a leadframe on a rail will not be transmitted from one rail to the other rail as the front and rear heater blocks 18, 28 are spaced from each other so that each heater block is substantially isolated from vibrations at the other heater block.

Moreover, as the front and rear indexers 20, 30 move only along the X direction to feed leadframes, use of a buffer loader and a buffer unloader found in the prior art discussed have been eliminated so that the disadvantages associated with the buffer tables as described have also been avoided. In particular, disturbance of the buffer tables during high-speed transfer motion is avoided so that the bonding system 32 is able to run at full speed with high accuracy.

The independently operating dual tracks permit the dual-track leadframe feeding system to function as a single track feeding system when one track malfunctions or needs overhaul. Hence, this cuts down the machine idling time. Also, when either the front module or the rear module is malfunctioning or being overhauled, the machine can still operate with the other module that is still functioning. The magazine cassette holds and transports multiple magazines in a continuous feeding path which improves the speed of loading or unloading leadframes and achieves zero idling time for swapping empty magazines with loaded ones. The magazine cassette, together with the adjustable rail pitch, reduces idling time of the bonding system so that bonding may be done at high speed and accurately.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus for bonding electronic devices including substrates, comprising:
    first and second rails arranged adjacent to each other which are configured to align the substrates in vertical orientations during transportation along the first and second rails;
    a bonding system locatable over a first bonding site located along the first rail and a second bonding site located along the second rail;
    a first indexer located adjacent to the first rail and a second indexer located adjacent to the second rail, each indexer being independently operative to transport a substrate along one rail while a substrate held on the other rail is being bonded;
    an input magazine located at one end of the first and second rails for holding multiple unbonded substrates in vertical orientations and operative to feed unbonded substrates directly to the first and second rails; and
    an output magazine located at an opposite end of the first and second rails from the input magazine, the output magazine holding multiple bonded substrates in vertical orientations,
    wherein each of the first and second rails is configured and operative to transport the substrates from the input magazine to the output magazine, and a distance between the first and second rails is adjustable to align the first and second rails with respective multiples of a substrate partition pitch of the input and output magazines in order to simultaneously receive unbonded substrates from the input magazine, and to simultaneously unload bonded substrates to the output magazine, the substrate partition pitch being the distance between adjacent partitions of the input and output magazines separating adjacent substrates.

2. The bonding apparatus as claimed in claim 1, further comprising a rail pitch adjustable guide on which the first rail is mounted such that a distance between the first and second rails is adjustable.

3. The bonding apparatus as claimed in claim 2, wherein each rail is mounted on an independent mounting base so that each rail functions in a single track configuration.

4. The bonding apparatus as claimed in claim 1, further comprising at least one container holder that is operative to hold a plurality of input magazines.

5. The bonding apparatus as claimed in claim 4, wherein the container holder is configured to hold at least four input magazines.

6. The bonding apparatus as claimed in claim 4, wherein the container holder is configured to hold two columns of input magazines.

7. The bonding apparatus as claimed in claim 6, wherein the each column of input magazines is alternately movable into alignment with the first and second rails for feeding further substrates to the first and second rails.

8. The bonding apparatus as claimed in claim 4, wherein the container holder is mounted to a container holder table that is operative to continuously move and align the input magazines simultaneously with the first and second rails for feeding additional substrates to the rails.

9. The bonding apparatus as claimed in claim 1, further comprising a first heater block next to the first bonding site and a second heater block next to the second bonding site, wherein the first heater block is spaced from the second heater block so that each heater block is substantially isolated from vibrations at the other heater block.

* * * * *